(12) United States Patent
Olarig

(10) Patent No.: US 7,100,071 B2
(45) Date of Patent: Aug. 29, 2006

(54) SYSTEM AND METHOD FOR ALLOCATING FAIL-OVER MEMORY

(75) Inventor: Sompong P. Olarig, Pleasanton, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 548 days.

(21) Appl. No.: 10/210,553

(22) Filed: Jul. 31, 2002

(65) Prior Publication Data

US 2003/0037278 A1 Feb. 20, 2003

Related U.S. Application Data

(63) Continuation-in-part of application No. 09/116,714, filed on Jul. 16, 1998, now Pat. No. 6,505,305.

(51) Int. Cl.
*G06F 11/00* (2006.01)

(52) U.S. Cl. .................... 714/5; 714/8; 711/6; 711/203

(58) Field of Classification Search .................... 714/5, 714/8, 7, 6; 711/6, 203
See application file for complete search history.

(56) References Cited

U.S. PATENT DOCUMENTS

| | | | | |
|---|---|---|---|---|
| 5,166,936 A | * | 11/1992 | Ewert et al. ................. | 714/723 |
| 5,566,316 A | * | 10/1996 | Fechner et al. .............. | 711/114 |
| 5,787,242 A | * | 7/1998 | DeKoning et al. ............. | 714/5 |
| 5,870,537 A | * | 2/1999 | Kern et al. .................... | 714/6 |
| 6,038,680 A | * | 3/2000 | Olarig ............................ | 714/6 |
| 6,052,798 A | * | 4/2000 | Jeddeloh ........................ | 714/8 |
| 6,154,853 A | * | 11/2000 | Kedem ........................... | 714/6 |
| 6,163,856 A | * | 12/2000 | Dion et al. ..................... | 714/4 |
| 6,269,431 B1 | * | 7/2001 | Dunham ..................... | 711/162 |
| 6,535,995 B1 | * | 3/2003 | Dobbek ........................... | 714/8 |
| 6,587,909 B1 | * | 7/2003 | Olarig et al. ............... | 710/302 |
| 6,598,174 B1 | * | 7/2003 | Parks et al. ..................... | 714/6 |
| 6,640,278 B1 | * | 10/2003 | Nolan et al. .................... | 711/6 |
| 6,915,448 B1 | * | 7/2005 | Murphy et al. ................ | 714/6 |
| 6,952,737 B1 | * | 10/2005 | Coates et al. ............... | 709/229 |
| 6,961,867 B1 | * | 11/2005 | Goodman et al. .............. | 714/5 |
| 2002/0071386 A1 | * | 6/2002 | Gronke ......................... | 370/217 |
| 2002/0087780 A1 | * | 7/2002 | Selkirk et al. ................. | 711/6 |
| 2003/0088743 A1 | * | 5/2003 | Rader ........................... | 711/148 |
| 2004/0078631 A1 | * | 4/2004 | Rogers et al. ................. | 714/5 |
| 2005/0132249 A1 | * | 6/2005 | Burton et al. .................. | 714/5 |
| 2005/0257080 A1 | * | 11/2005 | Santos et al. .................. | 714/5 |

OTHER PUBLICATIONS

Microsoft Computer Dictionary, 4th Edition, 1999, Microsoft Press, pp. 170-171.*

* cited by examiner

*Primary Examiner*—Robert Beausoliel
*Assistant Examiner*—Christopher McCarthy

(57) ABSTRACT

A fail-over system for memory is provided. The fail-over system for memory includes a virtual channel memory controller providing one or more virtual channel memories in a memory array. A memory fail-over controller coupled to the virtual channel memory controller provides memory fail-over data to the virtual channel memory controller. The virtual channel memory controller allocates one or more of the virtual channel memories to one or more fail-over memory channels in response to the memory fail-over data.

21 Claims, 3 Drawing Sheets

SYSTEM AND METHOD FOR ALLOCATING FAIL-OVER MEMORY

CROSS-REFERENCE TO RELATED APPLICATIONS

This application is a continuation-in-part of U.S. application Ser. No. 09/116,714, filed Jul. 16, 1998, now U.S. Pat. No. 6,505,305 which is hereby incorporated by reference for all purposes.

BACKGROUND OF THE INVENTION

1. Field of the Invention

The present invention relates generally to data memory and more specifically to a fail-over memory that uses an existing active auxiliary memory system as a fail-over memory.

2. Description of the Related Art

Systems and methods for managing data memory failure are known in the art. These systems and methods include marking a section of a memory as faulty when it experiences an excessive number of errors or when uncorrectable errors arise, and downshifting the number of port configurations when there is a hard memory failure on one of two memory ports. These systems and methods require system rebooting, which results in service interruption. These systems and methods also result in the loss of significant segments of the memory.

SUMMARY OF THE INVENTION

In accordance with the present invention, a system and method for fail-over memory are provided that overcome known problems with responding to memory failure.

In particular, a system and method for fail-over memory are disclosed that use an existing memory system, such as a virtual channel memory system, as the fail-over memory.

In accordance with an exemplary embodiment of the present invention, a fail-over system for memory is provided. The fail-over system for memory includes a virtual channel memory controller providing one or more virtual channel memories in a memory array. A memory fail-over controller coupled to the virtual channel memory controller provides memory fail-over data to the virtual channel memory controller. The virtual channel memory controller allocates one or more of the virtual channel memories to one or more fail-over memory channels in response to the memory fail-over data.

The present invention provides many important technical advantages. One important technical advantage is a fail-over system for memory that uses an existing memory system such as a virtual channel memory as the fail-over memory, such that the fail-over memory does not sit idle during normal operation.

Those skilled in the art will further appreciate the advantages and superior features of the invention together with other important aspects thereof on reading the detailed description that follows in conjunction with the drawings.

DETAILED DESCRIPTION OF THE INVENTION

Figure 1:
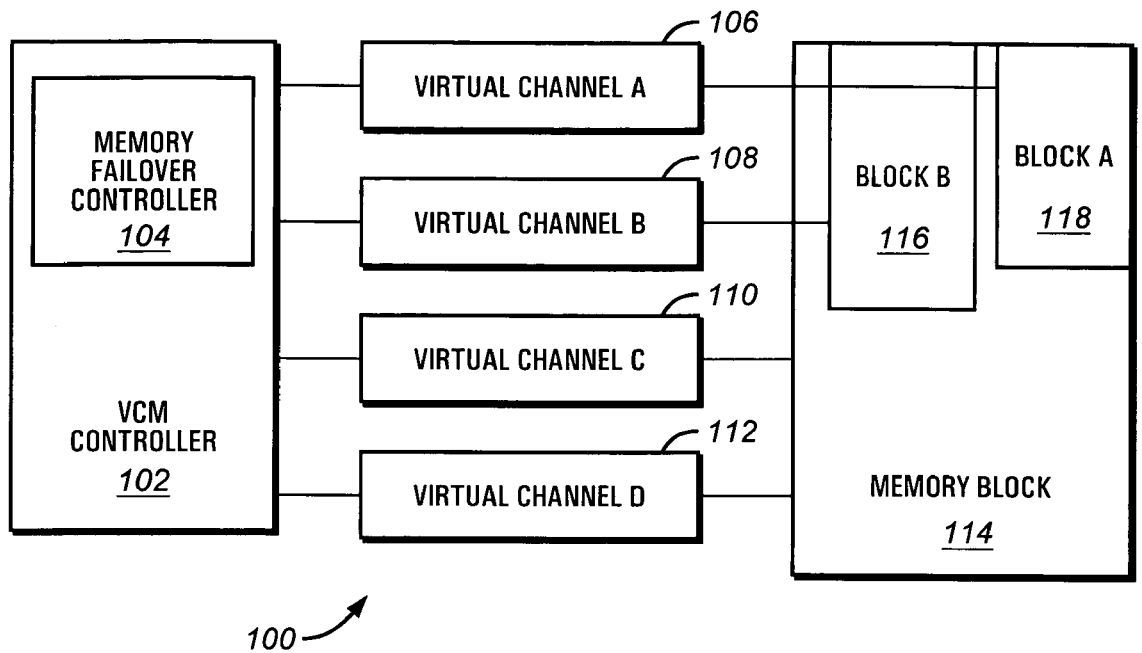
FIG. 1 is a diagram of a system for providing memory fail-over and a VCM controller in accordance with an exemplary embodiment of the present invention.

In the description that follows, like parts are marked throughout the specification and drawings with the same reference numerals, respectively. The drawing figures might not be to scale and certain components can be shown in generalized or schematic form and identified by commercial designations in the interest of clarity and conciseness.

FIG. 1 is a diagram of a system 100 for providing memory fail-over in a VCM controller in accordance with an exemplary embodiment of the present invention. System 100 allows a virtual channel memory or other suitable memory system to function as a fail-over memory so as to reduce the probability of in-service memory failures without the need for a dedicated fail-over memory system.

System 100 includes VCM controller 102, memory fail-over controller 104, virtual channel A 106, virtual channel B 108, virtual channel C 110, virtual channel D 112, and memory block 114, coupled as shown, each of which can be implemented in hardware or hardware and software, and which can be one or more silicon devices implemented on a silicon wafer. As used herein, a hardware system can include discrete or integrated semiconductor devices implemented in silicon, germanium, or other suitable materials; an application-specific integrated circuit; a field programmable gate array; or other suitable devices. A software system can include one or more objects, agents, threads, lines of code, subroutines, separate software applications, user-readable (source) code, machine-readable (object) code, two or more lines of code in two or more corresponding software applications, databases, or other suitable software architectures. In one exemplary embodiment, a software system can include one or more lines of code in a general purpose software application, such as an operating system of a memory controller, and one or more lines of software in a specific purpose software application. As used herein, the term "couple" and its cognate terms, such as "coupled" and "couples," can include a physical connection (such as through a conducting material in a semiconductor circuit), a logical connection (such as through one or more logical devices of a semiconducting circuit), a virtual connection (such as through one or more randomly assigned memory locations of a data memory device), other suitable connections, or a suitable combination of such connections. In one exemplary embodiment, systems or components can be coupled to other systems and components through intervening systems and components, such as through an operating system of a memory controller.

Memory block 114 includes block A 118 and block B 116, which are blocks of memory cells that form virtual channels within memory block 114. In one exemplary embodiment, memory block 114 can include one or more rows of memory cells, where block A 118 and block B 116 are selected from groups of memory cells from different rows, such that memory can be allocated in one or more virtual channels. System 100 includes virtual channel A 106, virtual channel B 108, virtual channel C 110, and virtual channel D 112, each of which can control one or more memory cells within memory block 114. As shown in FIG. 1, virtual channel A 106 controls block A 118, and virtual channel B 108 controls block B 116. The size of block A 118 and block B 116 can be adjusted by VCM controller 102 in response to memory requirements, and virtual channel C 110 and virtual channel D 112 can be used to allocate other blocks of memory cells within memory block 114 based upon system requirements.

VCM controller 102 controls virtual channel A 106 through virtual channel D 112. In one exemplary embodiment, VCM controller 102 receives memory requirements from an external system and allocates memory cells within memory block 114 to one or more virtual channels. In this exemplary embodiment, VCM controller 102 controls access to memory block 114 by assigning virtual channel A 106 through virtual channel D 112 to groups of memory cells within memory block 114, such as where the groups of memory cells do not need to be within a single row, column, or other architectural artifact of memory block 114. Likewise, VCM controller 102 and virtual channel A 106 through virtual channel D 112 can be active auxiliary memory systems that are or are not dedicated fail-over memory systems, or other suitable memory systems.

Memory fail-over controller 104 allows VCM controller 102 to change the state of a virtual channel from a virtual channel to a fail-over memory. In this exemplary embodiment, memory fail-over controller 104 can cause a virtual channel to be reallocated in response to detection of failed or failing memory cells, such as upon detection of incipient memory cell failure, excessive generation of error checking and correction (ECC) codes, or other suitable indicators, and to transfer data from the failed or failing memory cells to a fail-over memory. In this exemplary embodiment, the fail-over memory can be one of virtual channel A 106 through virtual channel D 112 or other suitable memories.

In operation, system 100 allows memory cell failure from memory block 114 to be corrected during operation by conversion of one or more of virtual channel A 106 through virtual channel D 112 to a fail-over memory. VCM controller 102 includes memory fail-over controller 104 which can detect incipient failure or catastrophic failure (i.e., failure without warning), and can configure an existing auxiliary memory system such as a virtual channel memory, shown as virtual channel A 106 through virtual channel D 112, to replace the failed memory block. In this manner, the failure of the memory cell or cells in memory block 114 does not necessarily result in catastrophic failure of the system, rebooting of the system, or other undesirable effects. Memory fail-over controller 104 and VCM controller 102 can also generate status data, such as to alert a service technician or other suitable personnel of the failure of the memory in memory block 114. Although replacing one virtual channel of virtual channel A 106 through virtual channel D 112 with a fail-over memory might not impact operating efficiency, memory storage capacity, or other factors in a way that bears on the function of a system using system 100, notification of repair may be desirable.

Figure 2:
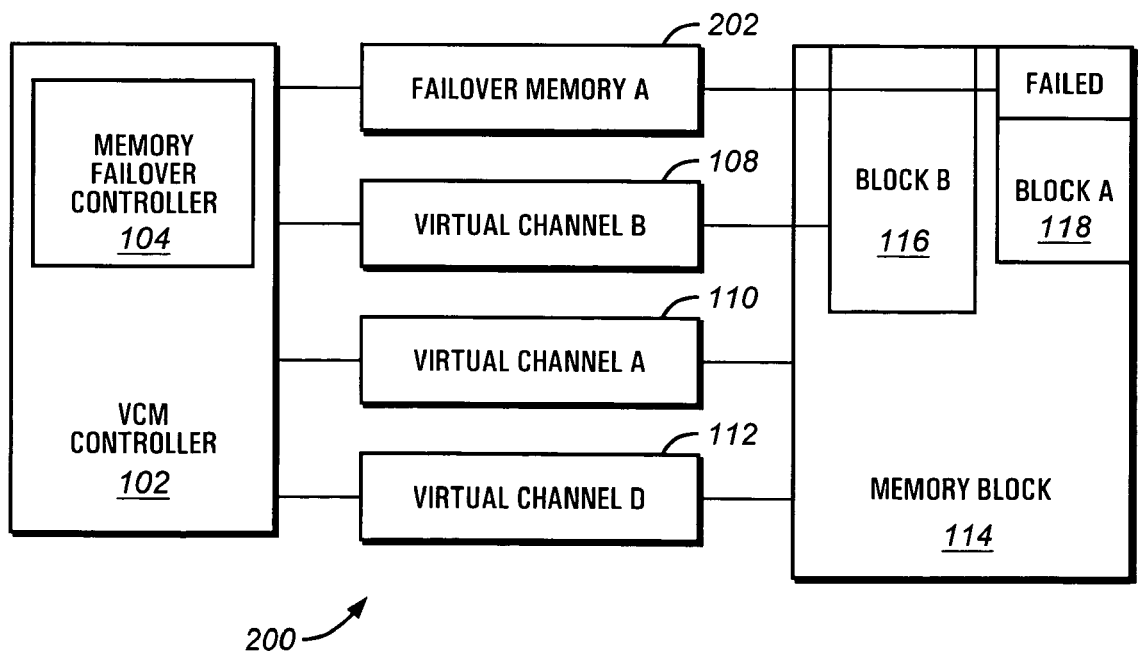
FIG. 2 is a diagram of a system showing a fail-over memory in place of a virtual channel memory in accordance with an exemplary embodiment in the present invention.

FIG. 2 is a diagram of a system 200 showing a fail-over memory in place of a virtual channel memory in accordance with an exemplary embodiment of the present invention. System 200 includes VCM controller 102 and memory fail-over controller 104, and further includes virtual channel A 106 that has been replaced by fail-over memory A 202. Virtual channel C 110 has also been replaced by virtual channel A. Block A 118 includes a failed block of memory as shown, which is assigned to fail-over memory A 202 so that virtual channel A includes the remaining operable blocks of memory in block A 118 and fail-over memory A 202. In this exemplary embodiment, VCM controller 102 can access the data stored in virtual channel A in combination with the data stored in fail-over memory A 202 to compensate for the failed block of memory in block A 118. Likewise, memory fail-over controller 104 controls the transfer of data from the failed block to fail-over memory A 202, reallocation of addressing and other data from virtual channel A 106 to fail-over memory A 202, and other suitable functions.

In operation, system 200 is an exemplary embodiment of a virtual channel memory operating as a fail-over memory. System 200 allows blocks of virtual channel memory in memory block 114 to be reallocated so as to allow a system using system 200 for memory access to continue operation in the event of failure of one or more memory cells with a block of memory without requiring system reboot.

Figure 3:
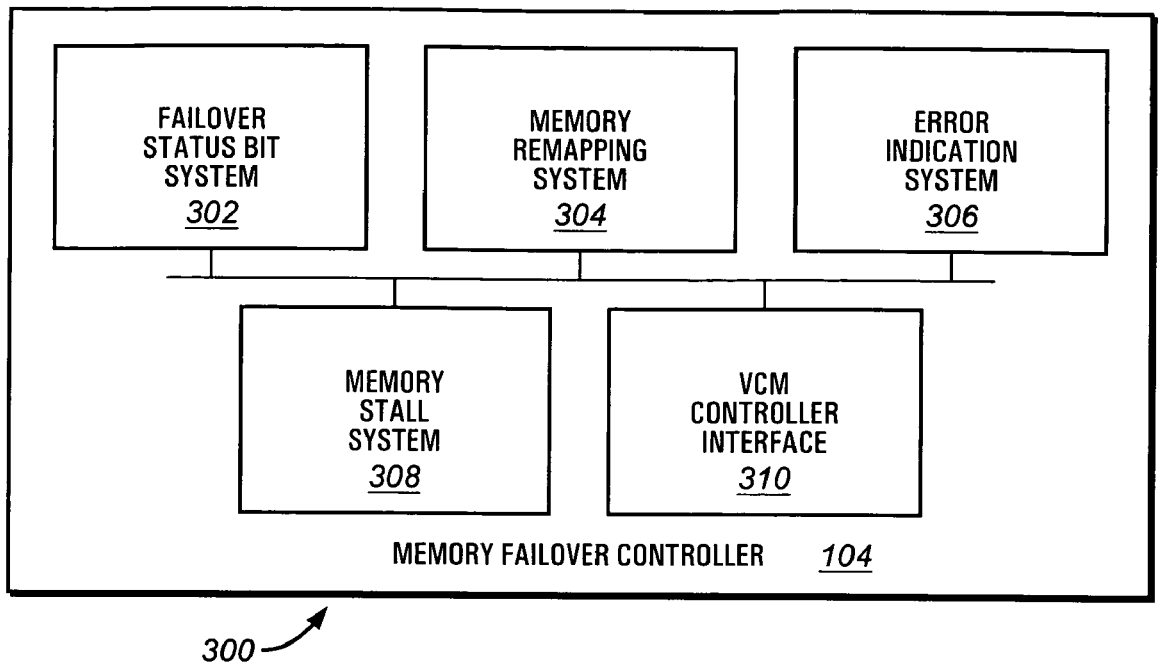
FIG. 3 is a diagram of a system for providing memory fail-over control in accordance with an exemplary embodiment of the present invention.

FIG. 3 is a diagram of a system 300 for providing memory fail-over control in accordance with an exemplary embodiment of the present invention. System 300 includes memory fail-over controller 104 and fail-over status system 302, memory remapping system 304, error indication system 306, memory stall system 308, and VCM controller interface 310, each of which can be implemented in hardware or a suitable combination of hardware and software, and which can be one or more hardware systems or one or more software systems operating on a memory controller platform or other suitable processing platforms.

Fail-over status system 302 generates status indication for virtual channels to indicate that they are operating as fail-over memories. In one exemplary embodiment, fail-over status system 302 can generate a status bit for a virtual channel status indicator that indicates that the virtual channel memory is operating in fail-over memory mode. In this exemplary embodiment, fail-over status system 302 allows virtual channels to be readily identified as to whether they should be handled as virtual channels or whether they have been assigned to operate as fail-over memory. In another exemplary embodiment, fail-over status system 302 prevents the fail-over memory from being evicted, such as to prevent a replacement algorithm from designating the virtual channel memory for replacement. Read and write commands to a cache-line address can result in hits to the cache, although write commands do not need to be written to memory block 114 or other main memory Memory remapping system 304 transfers memory from a failing virtual channel to a fail-over memory. In one exemplary embodiment, memory remapping system 304 retrieves data stored in failing memory cells of a memory block 114 or other suitable memories, and translates addresses for accessing the memory locations so as to reflect the new storage location of the data in a virtual channel memory. In this exemplary embodiment, memory remapping system 304 controls the transfer of memory from failing memory locations in a virtual memory channel to a fail-over memory, and also associates the new fail-over memory with the undamaged memory cells from the original virtual channel. In one exemplary embodiment, once excessive correctable errors are detected for a location by an ECC logic system, virtual channels can be reassigned, using the least critical as a fail-over memory, where the maximum fail-over memory size is a function of the size times the number of channels times the number of devices per memory module, or other suitable factors.

Error indication system 306 generates error indication data for use by other systems, operators, or other suitable processes. Error indication system 306 can generate a status bit in a register that is then transmitted to an operator or other system to generate notification that memory fail-over has occurred. Likewise, error indication system 306 can generate location data, failure time data, equipment type data, or other suitable data that may be required by a repair person to bring proper parts and locate the failed equipment. Error indication system 306 can also be implemented in or work in conjunction with an external system, where system loading factors are used to indicate whether continued operation with a virtual channel memory operating as a fail-over memory is feasible, such as where the external system that uses the memory is not being fully loaded and system operation is therefore not impacted by the operation of a virtual channel memory as a fail-over memory for extended periods of time.

Memory stall system 308 stalls access to memory during memory remapping. In one exemplary embodiment, memory stall system can be a prefetch command that is used to transfer data from a DRAM array to the designated channel. Other suitable systems or processes can be used to delay access to memory during the time when data is being transferred from a failing memory to a fail-over memory, when memory addresses are being reconfigured to address the correct memory locations, or when other processes required for the conversion of the virtual channel memory to a fail-over memory are being performed.

VCM controller interface 310 allows memory fail-over controller to interface with a VCM controller. In one exemplary embodiment, VCM controller interface 310 can be a data frame, a data bus, one ore more logical components, or other suitable interfaces. VCM controller interface 310 allows read and write commands to a remapped virtual channel to be processed without accessing the failed memory locations.

In operation, system 300 allows memory fail-over processes to be controlled in accordance with an exemplary embodiment of the present invention. System 300 provides fail-over status indication, remaps memory locations, generates an error indication to an operator indicating that memory fail-over has occurred, prevents access to the memory during data transfer between the failing memory and the fail-over memory, and allows the memory fail-over controller to interface with a virtual channel memory controller. In one exemplary embodiment, VCM control interface can interface with an existing VCM controller, such as in a separate chip, in software or firmware, or other suitable embodiments.

Figure 4:
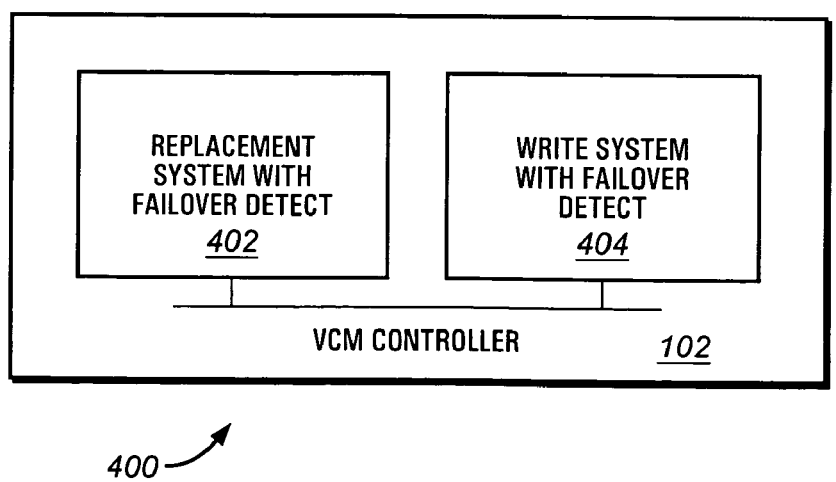
FIG. 4 is a diagram of a system for providing a virtual channel memory controller with fail-over memory capabilities in accordance with an exemplary embodiment of the present invention.

FIG. 4 is a diagram of a system 400 for providing a virtual channel memory controller with fail-over memory capabilities in accordance with an exemplary embodiment of the present invention. System 400 includes VCM controller 102, replacement system with fail-over detect 402 and write system with fail-over detect 404, each of which can be implemented in hardware, software, or a suitable combination of hardware and software, which can be one or more hardware systems, or one or more software systems operating on a memory controller platform or other suitable processing platforms.

Replacement system with fail-over detect 402 provides fail-over detect for virtual channels to prevent the virtual channel from being replaced. In one exemplary embodiment, virtual channels can be replaced when excessive ECC error codes are generated. Replacement system with fail-over detect 402 detects when a virtual channel is being used as a fail-over memory, and prevents replacement of the fail-over memory, such as by preventing the virtual channel memory from being designated for replacement by the replacement algorithm.

Write system with fail-over detect 404 prevents writing to a failed memory location when a fail-over memory has been designated to function in place of the failed memory location. In one exemplary embodiment, it may be necessary to prevent writing to a failed memory cells when they have been remapped to the fail-over memory. Write system with fail-over detect 404 prevents inadvertent writing to fail-over memory.

In operation, system 400 allows a virtual channel memory controller to be used in conjunction with a fail-over memory controller, such as by allowing reads to virtual channel memory locations that are being used as fail-over memories while preventing writes to the failed memory blocks, or in other suitable embodiments.

Figure 5:
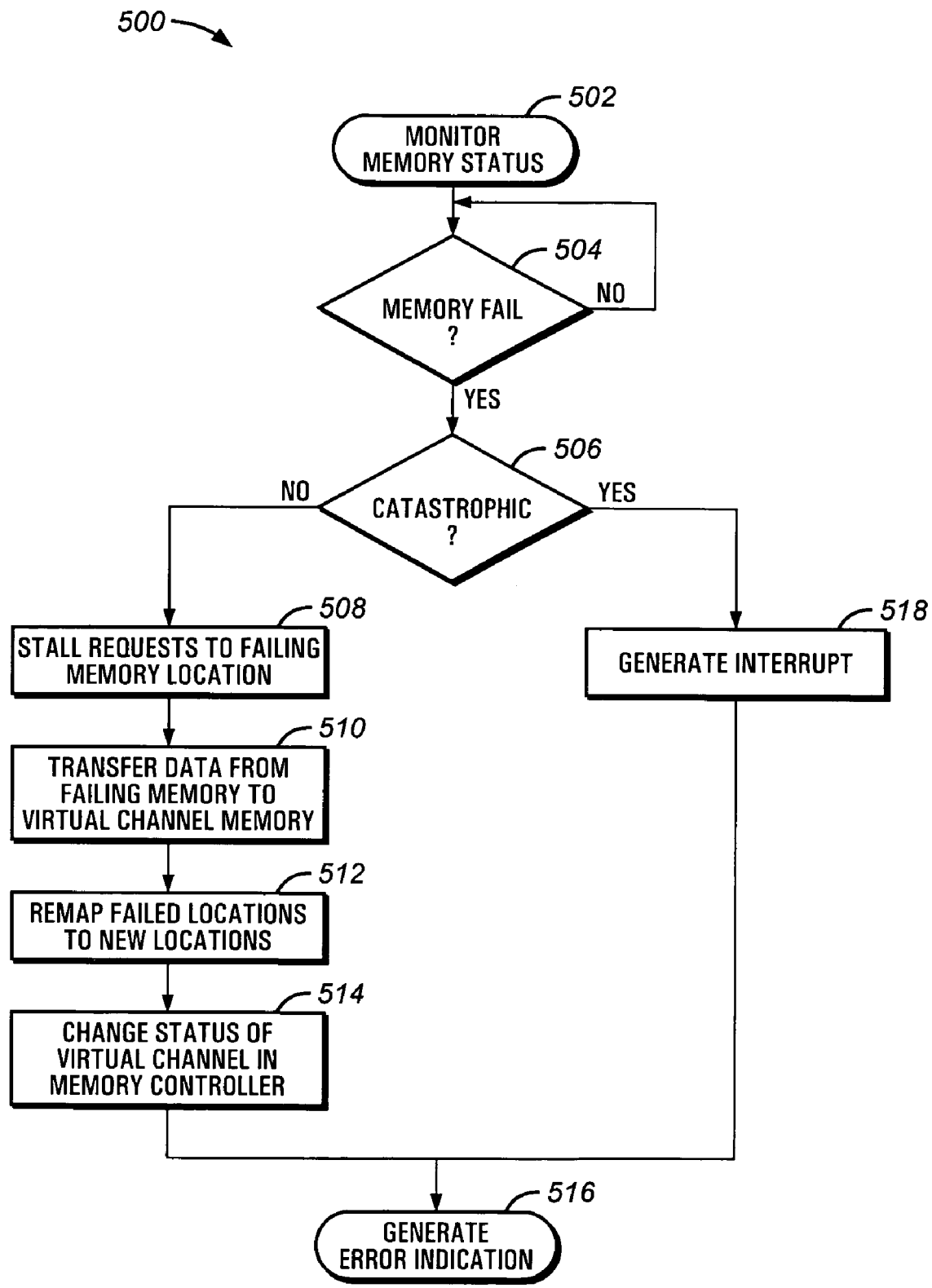
FIG. 5 is a flowchart of a method for providing fail-over memory in a virtual channel memory, an auxiliary memory, or other suitable memory systems that do not need to be in active or in a standby mode in accordance with an exemplary embodiment of the present invention.

FIG. 5 is a flowchart of a method 500 for providing fail-over memory using virtual channel memory, an auxiliary memory, or other suitable memory systems that do not need to be in active or in a standby mode in accordance with an exemplary embodiment of the present invention. Method 500 begins at 502 where memory status is monitored. In one exemplary embodiment, the monitor process can be performed to detect incipient memory cell failure, catastrophic memory cell failure, excessive ECC error code generation, or other suitable indicators of memory failure. The method then proceeds to 504.

At 504, it is determined whether the memory has failed. In one exemplary embodiment, if it is determined that the memory has failed, the method proceeds to 506. Otherwise, the method returns to 502.

At 506, it is determined whether the memory failure was catastrophic, such that recovery of the data stored in the failed memory locations will not be possible. If the memory failure was catastrophic, the method proceeds directly to 512. Otherwise, the method proceeds to 508 where requests to the failing memory location are stalled, such as by generation of a prefetch command to transfer data from the failing memory array to a designated virtual channel, auxiliary memory, memory system, or other suitable processes. The method then proceeds to 510 where the data is transferred from the failing memory location to the virtual channel memory or other suitable memory system that will operating as fail-over memory. The method then proceeds to 512. In one exemplary embodiment, in the case of an uncorrectable memory error, the memory controller can generate an NMI (Non Maskable Interrupt) to notify the system software of the catastrophic event.

At 512, the failed memory location is remapped to the new locations in the virtual channel memory or other suitable systems operating as fail-over memory. In one exemplary embodiment, memory addresses in a virtual channel memory controller, fail-over memory controller, or other suitable controllers are mapped so that the address for access to the data transferred from the failing memory location contains the proper memory location. The method then proceeds to 514 where status of the virtual channel memory or other suitable system in a memory controller is changed from a virtual channel memory to a fail-over memory, such as by assigning a fail-over indicator value to a fail-over status bit. In this exemplary embodiment, status is changed to prevent inadvertent allocation of the virtual channel memory to a new virtual channel, to prevent accessing of the fail-over memory as the previously allocated virtual channel memory, or other suitable processes. The method then proceeds to 516.

At 516, an error indication is generated. In one exemplary embodiment, the error indication can include a flag status indicator that shows the status of a virtual channel memory, can be an indicator showing the incipient failure of the memory device and generating a service request for service personnel to replace the memory device, or other suitable data. The error indication can also identify the unit in which the memory cell has failed, the physical location, the model number of the failed memory device, and other suitable data. The error indication can also be loading sensitive so as to delay replacement of the failed memory device when system loading does not require it. Additional processes can also or alternatively be performed, such as those described in U.S. application Ser. No. 09/116,714, filed Jul. 16, 1998, now U.S. Pat. No. 6,505,305, which is hereby incorporated by reference for all purposes.

In operation, method 500 allows the failure of memory cells in an array of memory cells to be detected, and for the failing cells to be remapped to a virtual channel memory or other suitable memory systems that operate in conjunction with the array of memory cells. Method 500 thus allows operation of a memory array to continue without rebooting even after one or more individual memory cells in the array have failed. Method 500 uses the virtual channel memory or other suitable memory systems that do not need to be inactive prior to operation as a fail-over memory, so as to allow the system using the memory to continue to operate without catastrophic failure. Method 500 can also generate indications to service personnel to replace the components.

In view of the above detailed description of the present invention and associated drawings, other modifications and variations will now become apparent to those skilled in the art. It should also be apparent that such other modifications and variations may be effected without departing from the spirit and scope of the present invention.

I claim:

1. A fail-over system comprising:
   a virtual channel memory controller providing virtual channel memories in a memory array having memory blocks, the virtual channel memories associated with respective memory blocks;
   a memory fail-over controller coupled to the virtual channel memory controller, the memory fail-over controller to detect memory failure in a first segment of one of the memory blocks, the one memory block also having a second segment that has not exhibited failure; and
   wherein the virtual channel memory controller allocates one or more of the virtual channel memories as one or more fail-over memories in response to detection of the memory failure, the one or more fail-over memories to store data in the first segment, and
   wherein the virtual channel memory controller allocates another of the virtual channel memories to the second segment of the one memory block.

2. The fail-over system of claim 1 wherein the memory fail-over controller further comprises a fail-over status system generating status data that indicates the virtual channel memories that are being used as fail-over memories.

3. The fail-over system of claim 1 wherein the memory fail-over controller further comprises a memory remapping system generating fail-over memory channel address data that corresponds to one or more failed memory locations in the memory array.

4. The fail-over system of claim 1 wherein the memory fail-over controller further comprises an error indication system generating error indication data in response to detection of memory failure.

5. The fail-over system of claim 3, wherein the memory fail-over controller further comprises a memory stall system stalling access to the fail-over memories during remapping.

6. The fail-over system of claim 5 wherein the memory stall system implements a prefetch command.

7. The fail-over system of claim 1 wherein the memory fail-over controller further comprises a virtual channel memory controller interface.

8. The fail-over system of claim 1 wherein the virtual channel memory controller further comprises a replacement system with fail-over detect.

9. The fail-over system of claim 1 wherein the virtual channel memory controller further comprises a write system with fail-over detect.

10. A method for providing a fail-over memory comprising:
    associating plural memory blocks with respective virtual channel memories;
    detecting a memory failure condition in a first segment of one of the memory blocks, the one memory block having a second segment not exhibiting failure;
    redesignating one or more of the virtual channel memories as a fail-over memory to store data of the first segment of the one memory block; and
    reallocating another one of the virtual channel memories to the second segment of the one memory block.

11. The method of claim 10 wherein detecting a memory failure condition comprises detecting an incipient failure.

12. The method of claim 11 further comprising transferring data stored in the first segment to the fail-over memory.

13. The method of claim 12 further comprising stalling requests to the first segment while transferring the data stored in the first segment to the fail-over memory.

14. The method of claim 10 wherein detecting a memory failure condition comprises detecting excessive ECC error codes.

15. The method of claim 10 wherein detecting a memory failure condition comprises detecting a catastrophic failure.

16. The method of claim 10 further comprising generating a notification that the one or more virtual channel memories is operating as a fail-over memory.

17. The method of claim 10, further comprising generating status data to indicate that the first virtual channel memory has changed state from the virtual channel memory to the fail-over memory.

18. A system comprising:
    a memory array containing plural memory blocks;
    a plurality of virtual channels to control respective memory blocks, the virtual channels providing virtual channel memories;
    a fail-over module to detect a defective portion of a first one of the memory blocks, the first one of the memory blocks also having a second portion that is not defective; and
    a controller to change a state of a first one of the virtual channel memories to a fail-over memory, the fail-over memory to store data from the defective portion of the first memory block, and
    the controller to change a state of a second one of the virtual channel memories to be associated with the second portion of the first memory block.

19. The system of claim 18, the fail-over module to transfer data from the defective portion of the first memory block to the fail-over memory.

20. The system of claim 19, the fail-over module to remap addressing of data in the defective portion to the fail-over memory.

21. The system of claim 18, the fail-over module to generate a status indication to indicate that the first virtual channel memory has been changed from a virtual channel memory to a fail-over memory.

* * * * *